May 7, 1963 R. P. LIPKIS 3,088,989

THERMOELECTRIC CONVERTER

Filed June 28, 1961 2 Sheets-Sheet 1

ROBERT P. LIPKIS
INVENTOR.

BY George C. Thompson
Don Finkelstein
AGENTS.

May 7, 1963 R. P. LIPKIS 3,088,989

THERMOELECTRIC CONVERTER

Filed June 28, 1961 2 Sheets-Sheet 2

ROBERT P. LIPKIS
INVENTOR.

BY George C. Thompson Jr.
Don Finkelstein
AGENTS.

United States Patent Office 3,088,989
Patented May 7, 1963

3,088,989
THERMOELECTRIC CONVERTER

Robert P. Lipkis, Los Angeles, Calif., assignor to Space Technology Laboratories, Inc., Los Angeles, Calif., a corporation of Delaware Filed June 28, 1961, Ser. No. 120,290
10 Claims. (Cl. 136—4)

This invention relates to thermoelectric converters and, more specifically, to improved arrangements for increasing the temperature difference between a hot junction and a cold junction of a thermoelectric converter and thereby increase its efficiency.

Thermoelectric converters are known in which electrical energy is generated in response to a temperature differential between a hot junction and a cold junction. The efficiency of operation of such thermoelectric converters may be considered as the amount of electrical energy developed in a given converter for the total temperature differential existing between the hot junction and the cold junction. While thermoelectric converters in the past have been able, to some extent, to provide moderate efficiencies by reducing conductive heat transfer between the hot junction and the cold junction, they have not always been completely satisfactory in reducing radiative and convective heat transfer between the hot junction and the cold junction and in reducing radiative heat losses from the hot junction.

Accordingly, it is an object of this invention to provide an improved thermoelectric converter.

It is another object of this invention to provide a thermoelectric converter in which the temperature difference between the hot junction and the cold junction is enhanced.

It is another object of this invention to provide a thermoelectric converter in which the radiative heat losses from the hot junction are reduced.

These and other objects are realized, in accordance with this invention, by providing an arrangement that minimizes radiative heat losses from the hot junction and also minimizes radiative and convective heat losses from the hot junction and between the hot junction and the cold junction.

In one embodiment of this invention a solar thermoelectric converter comprises a first substantially flat plate having a top surface adapted to receive solar electromagnetic radiation energy and a bottom surface and a second substantially flat plate spaced apart from the first plate and substantially parallel to and coextensive therewith having a top surface and a bottom surface. A plurality of semi-conductors, part of which are positively doped and part of which are negatively doped, are coupled to the bottom surface of the first plate to form the hot junctions of the thermoelectric converter and are coupled to the top surface of the second plate to form the cold junctions of the thermoelectric converter. Electrical insulators are also provided on the first plate and the second plate to effect a desired electrical arrangement. The bottom surfaces of the first plate and the top surface of the second plate are prepared to provide both a selective electrically conductive path as well as a low infrared electromagnetic radiation emissivity to thereby minimize radiative heat transfer therebetween. The top surface of the first plate is provided to have a high solar electromagnetic radiation absorptivity and a low infrared electromagnetic radiation emissivity.

Substantially parallel to and coextensive with the first plate and spaced apart from the top surface thereof there is provided at least one film means that is substantially transparent to solar electromagnetic radiation energy and substantially opaque to infrared electromagnetic radiation energy. The film means is intermediate the top surface of the first plate and the sun and, if more than one film means is utilized, each such film means is spaced apart from and substantially parallel to the adjacent film means.

Solar electromagnetic radiation energy is transmitted through the film means and is absorbed by the top surface of the first plate thereby raising the temperature of the first plate. Electromagnetic radiation emitted from the top and bottom surfaces of the first plate is substantially in the infrared portion of the electromagnetic radiation spectrum. This emitted infrared electromagnetic radiation from the top surface is partially absorbed and partially reflected by the film means which, as noted above, is substantially opaque to infrared electromagnetic radiation. Consequently, the radiative heat loss from the first plate is substantially reduced.

In another embodiment of applicant's invention a thermoelectric converter, substantially as described above, is provided with sealing means around the edges thereof and the space between the film means and the first plate is maintained at substantially a vacuum on the order of less than $5 \times 10^{-3}$ millimeters of mercury absolute to substantially eliminate gas conductive and convective heat transfer therebetween. The space between the first plate and the second plate also is maintained at such a vacuum. Convective and gas conductive heat losses from the first plate are thereby reduced, thus increasing the temperature differential between the hot junctions and the cold junctions.

In yet another embodiment of this invention a thermoelectric converter is provided with a radiation shield intermediate the first plate and the second plate and electrically insulated from the semi-conductor materials. The radiation shield lowers radiative heat transfer between the first plate and the second plate thereby enhancing the temperature differential therebetween.

The above and other embodiments of this invention are more fully disclosed in the following detailed description with reference to the accompanying drawing wherein similar reference characters refer to similar elements and in which.

Figures 1, 4:
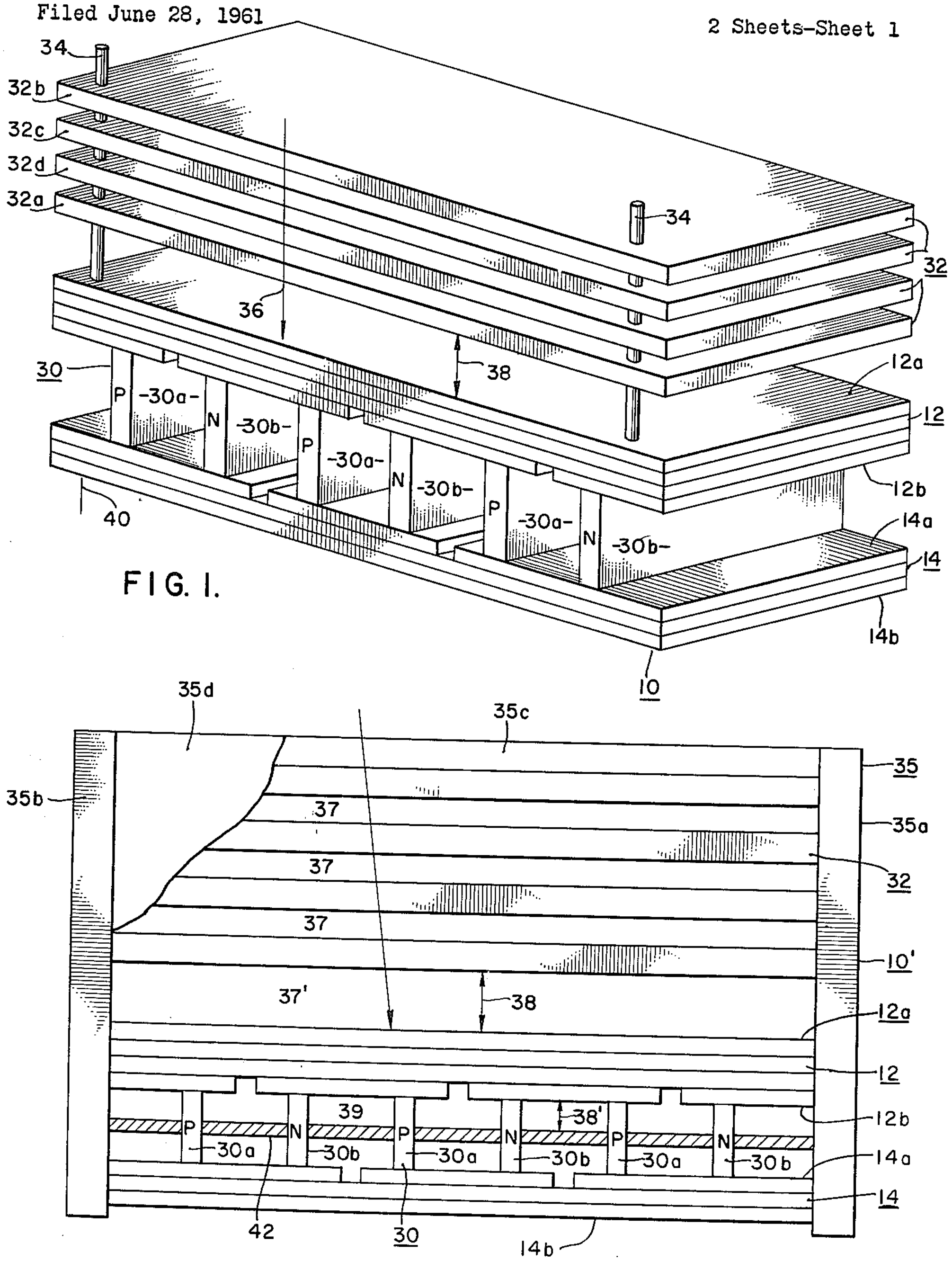
FIG. 1 is a pictorial representation of one embodiment of applicant's invention.
FIGURE 4 is a sectional view of another embodiment of applicant's invention.

Referring now to FIGURE 1, there is shown a thermoelectric converter, referred to generally as 10, according to applicant's invention. The thermoelectric converter 10 is comprised of a first plate 12 and a second plate 14. The first plate 12 is substantially flat and has a top surface 12*a* that exhibits a high absorptivity for solar electromagnetic radiation and a low emissivity for infrared electromagnetic radiation. The first plate 12 has a bottom surface 12*b* that exhibits a low emissivity for infrared electromagnetic radiation. The bottom surface 12*b* of the first plate 12 is selectively electrically conductive.

Figure 2:
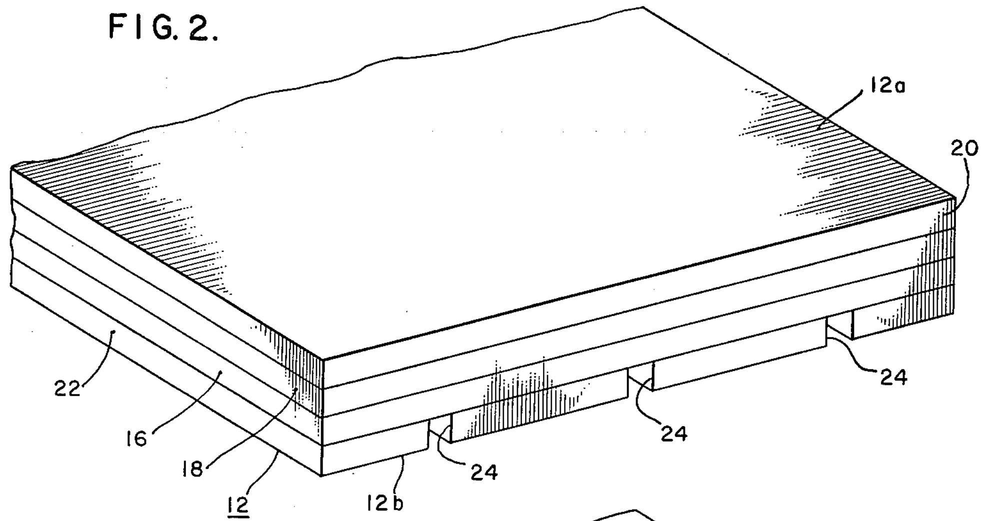
FIGURES 2 and 3 are pictorial representations of elements shown on FIGURE 1.

There are numerous configurations of materials suitable for utilization as the first plate 12. One such configuration is illustrated in FIGURE 2 wherein there is shown a sandwich arrangement of materials that provides the desired radiative and electrical properties. A body member 16, which for example may be an electrical insulating coated thin metallic sheet or a plastic such as a glass fiber reinforced resin, is coated on one side with a vacuum deposited opaque layer of aluminum 18. A layer of titanium 20 is deposited on the opaque layer of aluminum 18 to form a sandwich construction. This configuration for the top surface 12*a* of first plate 12 is more fully described in the copending application entitled "Electromagnetic Radiation Energy Arrangement," filed May 26, 1961, Serial Number 112,999, Robert P. Lipkis and John E. Vehrencamp, inventors, and provides a top surface 12*a* that exhibits a high solar electromagnetic radiation absorptivity and a low infrared electromagnetic radiation emissivity. An electrically conductive layer 22, which may be aluminum, silver, gold, or any other electrically conductive material, is bonded on the opposite side of the body member 16 to form the low infrared emitting bottom surface 12*b*. The layer 22 provides a substantially smooth, shiny metal surface 12*b* which has a low infrared electromagnetic radiation emissivity. Grooves 24 are marked in the layer 22 and substantially all of the layer 22 is removed down to the electrical insulating body member 16 at preselected positions. The placement of the grooves 24 is dependent upon the particular electrical circuit arrangement desired in the thermoelectric converter 10.

Figure 3:
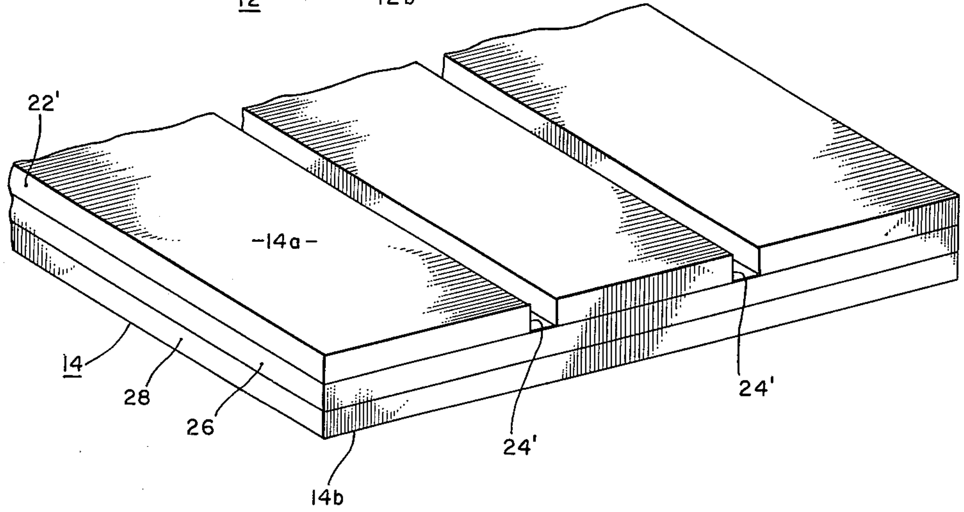

Referring back now to FIGURE 1, the second plate 14 is substantially parallel to and coextensive with the first plate 12. A top surface 14*a* exhibits a low emissivity for infrared electromagnetic radiation and a bottom surface 14*b* exhibits a high emissivity for infrared electromagnetic radiation. There are also many configurations of materials suitable for utilization as the second plate 14. FIGURE 3 illustrates one such arrangement and there is shown thereon an electrically insulating body member 26 which, for example, may be a glass fiber reinforced resin plastic which has an electrically conductive layer 22′ bonded on one side thereof. This layer 22′ is substantially the same as the layer 22 of the first plate 12. Grooves 24′ are cut in the layer 22′ down to the electrically insulating body member 26 at preselected positions to provide a predetermined electrical configuration for the thermoelectric converter 10. A layer 28 is deposited on the other side of the body member 26 to provide the bottom surface 14*b* that exhibits a high emissivity for infrared electromagnetic radiation. The layer 28 may may be, for example, a roughened layer of carbon black or a black metal oxide layer which, as is known, approaches an emissivity of one. However, other well-known materials may equally well be used for the layer 28 to provide a high infrared emissivity bottom surface 14*b*.

Referring back now to FIGURE 1, a plurality of semi-conductors 30 are shown coupled to the layers 22 and 22′ of the first plate 12 and second plate 14, respectively. The semi-conductors 30 may be lead telluride, lead selenide, or any other of the well-known semi-conductor materials. A first portion 30*a* of the semi-conductors 30 is positively doped to form one side of the desired electrical path and a second portion 30*b* of the semi-conductors 30 is negatively doped to provide the other side of the desired electrical path. The semi-conductors 30 are coupled to the layer 22 of the first plate 12 and to the layer 22′ of the second plate 14 in a predetermined electrical array. The particular array is selected to provide the desired electrical characteristics, e.g., voltage, current, or other characteristics required from the thermoelectric converter 10. The grooves 24 and 24′ provide electrical insulation in the electrically conductive layers 22 and 22′, respectively, to achieve the desired electrical characteristics.

A plurality of film means 32 is spaced apart from and substantially coextensive with and parallel to the top surface 12*a* of the first plate 12. The film means 32 are also spaced apart from each other and are supported by supports 34 which are thermally insulated from both the first plate 12 and the film means 32. The film means 32 are substantially transparent to solar electromagnetic radiation but substantially opaque to infrared electromagnetic radiation. Thus, the film means 32 may either be absorptive of infrared electromagnetic radiation or, in the preferred arrangement of applicant's invention, reflective of infrared electromagnetic radiation. The film means 32 may be fabricated from thin sheets of glass, plastic, quartz, or the like.

In operation, the top surface 12*a* of first plate 12 is positioned to receive solar electromagnetic radiation, indicated by arrow 36, which is transmitted through the film means 32 and is incident upon the top surface 12*a*. Since the top surface 12*a* exhibits a high absorptivity for solar electromagnetic radiation, such radiation is substantially absorbed thus raising the temperature of the first plate 12. Since the thermoelectric converter 10 is oriented so that the top surface 12*a* of the first plate 12 receives solar electromagnetic radiation, the second plate 14 is thereby shielded from such solar electromagnetic radiation and, hence, does not exhibit an increase in temperature due to direct solar electromagnetic radiation.

Electromagnetic radiation emitted from both the top surface 12*a* and the bottom surface 12*b* of the first plate 12 is substantially in the infrared portion of the electromagnetic spectrum. The infrared radiation emitted from the top surface 12*a*, indicated by arrow 38, is incident upon a first of the film means 32*a* and since the film means 32*a* is substantially opaque to infrared electromagnetic radiation 38, it is partially absorbed thereby and partially reflected back to the surface 12*a*. The absorption of this infrared electromagnetic radiation by the film means 32*a* tends to increase the temperature of the film means 32*a* and, as the temperature of the film means 32*a* rises, radiative heat transfer therebetween is substantially diminished. Infraded electromagnetic radiation emitted from the other film means 32*b*, 32*c*, and 32*d* undergo substantially similar absorption-reflection reactions which tend ultimately to decrease the radiative heat losses from the first plate 12.

Infrared radiation is also emitted from the bottom surface 12*b* of the first plate 12 as well as the top surface 14*a* of the second plate 14. However, since these surfaces are poor infrared emitters and poor infrared absorbers, there is comparatively little radiative heat transfer between the first plate 12 and the second plate 14.

The bottom surface 14*b* of the second plate 14 emits infrared electromagnetic radiation, indicated by the arrow 40, and, as described above, the bottom surface 14*b* exhibits a high emissivity for infrared electromagnetic radiation. This infrared electromagnetic radiation 40 leaves the second plate 14, thereby increasing the temperature differential between the first plate 12 and the second plate 14. Since the total electrical energy available from the thermoelectric converter 10 is proportional to the temperature difference maintained between the first plate 12 and the second plate 14, minimizing the radiative heat losses from the first plate 12 and increasing the radiative heat loss from the bottom surface 14*b* of the second plate 14 increases the electrical power available from the thermoelectric converter 10.

FIGURE 4 shows another embodiment of applicant's invention. A thermoelectric converter 10′ is shown which is similar to the thermoelectric converter 10 illustrated in FIGURE 1; however, the thermoelectric converter 10′ also includes sealing means 35*a* and 35*b* which are connected to the edges of the thermoelectric converter 10′. Similarly, a rear wall portion 35*c* and front wall portion 35*d* are connected to the back and the front, respectively, of thermoelectric converted 10′ and sealed thereto. The seals between the sealing means 35*a*, 35*b*, 35*c* and 35*d* are hermetic seals to permit maintaining substantially a vacuum in the spaces 37 between adjacent film means 32 and the spaces 37′ between the first plate 12 and the first film means 32*a* as well as the spaces 39 between the first plate 12 and the second plate 14. Maintaining these spaces at substantially a vacuum reduces the conductive and convective heat transfer from the first plate 12.

It will be appreciated that the spaces 37 and 37′ need not be maintained at a complete vacuum; maintaining a gas pressure in these spaces on the order of $10^{-4}$ millimeters of mercury absolute or less will provide the desired heat transfer reduction. If this arrangement were to be utilized in outer space applications, however, wherein substantial complete vacuum is the standard environment, the sealing means *35a, 35b, 35c* and *35d* would, of course, not be required. The sealing means *35a, 35b, 35c* and *35d* are thermally insulated from the elements of the thermoelectric converter 10' to minimize conductive heat transfer therebetween and preferably are made of a material having a low thermal conductivity such as a glass fiber reinforced resin plastic.

A radiation shield means 42 is intermediate the first plate 12 and the second plate 14 and is of a material that is highly reflective of infrared electromagnetic radiation. The shield means 42 is electrically insulated from the semi-conductor elements 30 and may, for example, be fabricated of a thin plastic sheet aluminized on both sides, crumpled aluminum foil, or the like.

Operation of this embodiment is substantially the same as described in connection with the embodiment shown on FIGURE 1 and solar electromagnetic radiation 36 is transmitted through the film means 32 and absorbed by the top surface 12a of the first plate 12. This establishes a large temperature differential between the first plate 12 and the second plate 14 thereby providing the requisite temperature differential for operation of the thermoelectric converter 10'. Infrared electromagnetic radiation 38 emitted from the top surface 12a of the first plate 12 is not appreciably transmitted through the first film means 32a and infrared electromagnetic radiation 38' emitted from the bottom surface 12b of the first plate 12 is substantially attenuated by the radiation shield means 42 thus minimizing heat losses from the first plate 12 to maintain a large temperature differential between the first plate 12 and the second plate 14.

While the embodiments shown in FIGURE 1 and FIGURE 4 comprise a plurality of film means 32, it is apparent that even one film means will provide a high degree of increased efficiency to the operation of the thermoelectric converter 10 and thermoelectric converter 10'. Thus, in the practice of applicant's invention, at least one film means 32 is preferably employed.

This concludes the description of the embodiments of applicant's invention. From the above, it is apparent that applicant has invented a new and improved thermoelectric converter.

Those skilled in the art will find many variations and adaptations of applicant's invention. Therefore, the foregoing description of the various embodiments of applicant's invention together with the accompanying drawings are intended to be illustrative and not limiting and the appended claims are intended to cover all variations and adaptations within the true scope and spirit of this invention.

What is claimed as new and is desired to be secured by Letters Patent of the United States is:

1. An improved solar thermoelectric converter for converting thermal energy into electrical energy comprising, in combination: a first plate comprising a top surface and a selectively electrically conductive bottom surface, said top surface adapted to be oriented towards the sun and having a high absorptivity for solar electromagnetic radiation energy and a low emissivity for infrared electromagnetic radiation energy and said bottom surface having a low emissivity for infrared electromagnetic radiation; a second plate spaced apart from said bottom surface of said first plate and substantially parallel thereto having a bottom surface and a selectively electrically conductive top surface facing said bottom surface of said first plate, said top surface having a low emissivity for infrared electromagnetic radiation and said bottom surface having a high emissivity for infrared electromagnetic radiation; a plurality of semi-conductors connected to the bottom surface of said first plate and the top surface of said second plate in a preselected array, a first portion of said semi-conductors positively doped and a second portion of said semi-conductors negatively doped; means coupled to said first plate and said second plate for connecting said plurality of semi-conductors in a predetermined electrical circuit arrangement; and at least one film means spaced apart from said top surface of said first plate and substantially coextensive therewith and parallel thereto, said film means substantially transparent to solar electromagnetic radiation energy and substantially opaque to infrared electromagnetic radiation energy whereby solar electromagnetic radiation energy is admitted to and absorbed by said top surface of said first plate thereby raising the temperature thereof and whereby loss of energy from said top surface of said first plate by radiation in the infrared portion of the electromagnetic radiation spectrum is substantially reduced.

2. An improved thermoelectric converter comprising, in combination: a first plate having a top surface and an electrically conductive bottom surface, said top surface adapted to be oriented towards the sun and having a high absorptivity for solar electromagnetic radiation energy and a low emissivity for infrared electromagnetic radiation energy and said bottom surface having a low emissivity for infrared electromagnetic radiation; a second plate spaced apart from said bottom surface of said first plate and substantially parallel thereto having an electrically conductive top surface facing said bottom surface of said first plate and a bottom surface, said top surface having a low emissivity for infrared electromagnetic radiation and said bottom surface having a high emissivity for infrared electromagnetic radiation; a plurality of semi-conductors connected to the bottom surface of said first plate and the top surface of said second plate in a preselected array, a first portion of said semi-conductors positively doped and a second portion of said semi-conductors negatively doped; means coupled to said first plate and said second plate for connecting said plurality of semi-conductors in a predetermined electrical circuit arrangement; and a plurality of spaced apart film means, each of said film means substantially transparent to solar electromagnetic radiation energy and substantially opaque to infrared electromagnetic radiation energy, said plurality of film means spaced apart from said top surface of said first plate and substantially coextensive therewith and parallel thereto whereby solar electromagnetic radiation energy is admitted to and absorbed by said top surface of said first plate thereby raising the temperature thereof and whereby loss of energy from said top surface of said first plate by radiation in the infrared portion of the electromagnetic radiation spectrum is substantially reduced.

3. An improved thermoelectric converter comprising, in combination: a first plate having a top surface and an electrically conductive bottom surface, said top surface adapted to be oriented towards the sun and having a high absorptivity for solar electromagnetic radiation energy and a low emissivity for infrared electromagnetic radiation energy and said bottom surface having a low emissivity for infrared electromagnetic radiation; a second plate spaced apart from said bottom surface of said first plate and substantially parallel thereto having an electrically conductive top surface facing said bottom surface of said first plate and a bottom surface, said top surface having a low emissivity for infrared electromagnetic radiation and said bottom surface having a high emissivity for infrared electromagnetic radiation; a plurality of semi-conductors connected to the bottom surface of said first plate and the top surface of said second plate in a preselected array, a first portion of said semi-conductors positively doped and a second portion of said semi-conductors negatively doped; radiation shield means intermediate said first plate and said second plate and electrically insulated from each of said plurality of semi-conductors, said shield means having an infrared reflecting top surface substantially parallel to and spaced apart from said bottom surface of said first plate and an infrared reflecting bottom surface substantially parallel to and spaced apart from said top surface of said second plate whereby radiative heat transfer between said first plate and said second plate is substantially reduced; means coupled to said first plate and said second plate for connecting said plurality of semi-conductors in a predetermined electrical circuit arrangement; and at least one film means spaced apart from said top surface of said first plate and substantially coextensive therewith and parallel thereto, said film means substantially transparent to solar electromagnetic radiation energy and substantially opaque to infrared electromagnetic radiation energy whereby solar electromagnetic radiation energy is admitted to and absorbed by said top surface of said first plate thereby raising the temperature thereof and whereby loss of energy from said top surface of said first plate by radiation in the infrared portion of the electromagnetic radiation spectrum is substantially reduced.

4. The arrangement defined in claim 3, wherein said film means is radiation darkening resistant.

5. The arrangement defined in claim 3, wherein said film means is comprised of cerium oxide glass.

6. The arrangement defined in claim 3, wherein said film means is comprised of quartz.

7. An improved thermoelectric converter for converting thermal energy into electrical energy comprising, in combination: a first plate having a top surface and an electrically conductive bottom surface, said top surface adapted to be oriented towards the sun and having a high absorptivity for solar electromagnetic radiation energy and a low emissivity for infrared electromagnetic radiation energy and said bottom surface having a low emissivity for infrared electromagnetic radiation; a second plate spaced apart from said bottom surface of said first plate and substantially parallel thereto having an electrically conductive top surface facing said bottom surface of said first plate and a bottom surface, said top surface having a low emissivity for infrared electromagnetic radiation and said bottom surface having a high emissivity for infrared electromagnetic radiation; means coupled to said first plate and to said second plate for generating electric energy in response to the temperature difference between said first plate and said second plate; and at least one film means spaced apart from said top surface of said first plate and substantially coextensive therewith and parallel thereto, said film means substantially transparent to solar electromagnetic radiation energy and substantially opaque to infrared electromagnetic radiation energy whereby solar electromagnetic radiation energy is admitted to and absorbed by said top surface of said first plate thereby raising the temperature thereof and whereby loss of energy from said top surface of said first plate by radiation in the infrared portion of the electromagnetic radiation spectrum is substantially reduced.

8. An improved thermoelectric converter for converting thermal energy into electrical energy comprising, in combination: a first plate having a top surface and an electrically conductive bottom surface, said top surface adapted to be oriented towards the sun and having a high absorptivity for solar electromagnetic radiation energy and a low emissivity for infrared electromagnetic radiation energy and said bottom surface having a low emissivity for infrared electro-magnetic radiation; a second plate spaced apart from said bottom surface of said first plate and substantially parallel thereto having an electrically conductive top surface facing said bottom surface of said first plate and a bottom surface, said top surface having a low emissivity for infrared electromagnetic radiation and said bottom surface having a high emissivity for infrared electromagnetic radiation; means coupled to said first plate and to said second plate for generating electric energy in response to the temperature difference between said first plate and said second plate; radiation shield means intermediate said first plate and said second plate for reducing radiative heat transfer therebetween; and at least one film means spaced apart from said top surface of said first plate and substantially coextensive therewith and parallel thereto, said film means substantially transparent to solar electromagnetic radiation energy and substantially opaque to infrared electromagnetic radiation energy whereby solar electromagnetic radiation energy is admitted to and absorbed by said top surface of said first plate thereby raising the temperature thereof and whereby loss of energy from said top surface of said first plate by radiation in the infrared portion of the electromagnetic radiation spectrum is substantially reduced.

9. An improved thermoelectric converter comprising, in combination: a first plate having a top surface and an electrically conductive bottom surface, said top surface adapted to be oriented towards the sun and having a high absorptivity for solar electromagnetic radiation energy and a low emissivity for infrared electromagnetic radiation energy and said bottom surface having a low emissivity for infrared electromagnetic radiation; a second plate spaced apart from said bottom surface of said first plate and substantially parallel thereto having an electrically conductive top surface facing said bottom surface of said first plate and a bottom surface, said top surface having a low emissivity for infrared electromagnetic radiation and said bottom surface having a high emissivity for infrared electromagnetic radiation; means coupled to said first plate and to said second plate for generating electric energy in response to the temperature difference between said first plate and said second plate; radiation shield means intermediate said first plate and said second plate for reducing radiative heat transfer therebetween; and a plurality of spaced apart film means, each of said film means substantially transparent to solar electromagnetic radiation energy and substantially opaque to infrared electromagnetic radiation energy, said plurality of film means spaced apart from said top surface of said first plate and substantially coextensive therewith and parallel thereto whereby solar electromagnetic radiation energy is admitted to and absorbed by said top surface of said first plate thereby raising the temperature thereof and whereby loss of energy from said top surface of said first plate by radiation in the infrared portion of the electromagnetic radiation spectrum is substantially reduced.

10. In combination: a first plate having a top surface and an electrically conductive bottom surface, said top surface adapted to be oriented towards the sun and having a high absorptivity for solar electromagnetic radiation energy and a low emissivity for infrared electromagnetic radiation energy and said bottom surface having a low emissivity for infrared electromagnetic radiation; a second plate spaced apart from said bottom surface of said first plate and substantially parallel thereto having an electrically conductive top surface facing said bottom surface of said first plate and a bottom surface, said top surface having a low emissivity for infrared electromagnetic radiation and said bottom surface having a high emissivity for infrared electromagnetic radiation; means coupled to said first plate and to said second plate for generating electric energy in response to the temperature difference between said first plate and said second plate; radiation shield means intermediate said first plate and said second plate for reducing radiative heat transfer therebetween; a plurality of spaced apart film means, each of said film means substantially transparent to solar electromagnetic radiation energy and substantially opaque to infrared electromagnetic radiation energy, said plurality of film means intermediate the sun and said first plate and spaced apart from said top surface of said first plate and substantially coextensive therewith and parallel thereto whereby solar electromagnetic radiation energy is admitted to and absorbed by said top surface of said first plate thereby raising the temperature thereof and loss of energy from said top surface of said first plate by radiation in the infrared portion of the electromagnetic radiation spectrum is substantially reduced; wall means coupled to said first plate for maintaining the spaces between each of said plurality of film means and the space between said plurality of film means and said top surface of said first plate at a pressure less than approximately $10^{-4}$ millimeters of mercury absolute; and thermal insulation means coupled to said wall means for preventing conductive heat transfer from said wall means to said film means.

References Cited in the file of this patent

UNITED STATES PATENTS

| | | |
|---|---|---|
| 1,077,219 | Coblentz | Oct. 28, 1913 |
| 2,984,696 | Shaffer | May 16, 1961 |

FOREIGN PATENTS

| | | |
|---|---|---|
| 617,122 | Germany | Aug. 13, 1935 |